United States Patent
Kawahara et al.

(10) Patent No.: US 7,462,921 B2
(45) Date of Patent: Dec. 9, 2008

(54) INTEGRATED CIRCUIT DEVICE, METHOD OF MANUFACTURING THE SAME AND METHOD OF FORMING VANADIUM OXIDE FILM

(75) Inventors: Naoyoshi Kawahara, Kanagawa (JP); Hiroshi Murase, Kanagawa (JP); Hiroaki Ohkubo, Kanagawa (JP); Yasutaka Nakashiba, Kanagawa (JP); Naoki Oda, Tokyo (JP); Tokuhito Sasaki, Tokyo (JP); Nobukazu Ito, Tokyo (JP)

(73) Assignees: NEC Corporation, Tokyo (JP); NEC Electronics Corporation, Kanagawa, Kawasaki (JP)

( * ) Notice: Subject to any disclaimer, the term of this patent is extended or adjusted under 35 U.S.C. 154(b) by 541 days.

(21) Appl. No.: 11/086,743

(22) Filed: Mar. 23, 2005

(65) Prior Publication Data

US 2005/0221573 A1    Oct. 6, 2005

(30) Foreign Application Priority Data

Mar. 30, 2004   (JP) ............................ 2004-101108

(51) Int. Cl.
*H01L 31/058* (2006.01)
*H01L 29/00* (2006.01)
*H01L 21/00* (2006.01)

(52) U.S. Cl. .................. 257/467; 257/536; 257/537; 257/E27.016; 438/48; 438/54; 438/384

(58) Field of Classification Search ................... 438/48, 438/54, 381, 382, 384; 257/467, 536, 537
See application file for complete search history.

(56) References Cited

U.S. PATENT DOCUMENTS

2002/0139784 A1 * 10/2002 Tsuchiya et al. ........ 219/121.69

FOREIGN PATENT DOCUMENTS

| JP | 01-302849 | 12/1989 |
|----|-----------|---------|
| JP | 11-330051 | 11/1999 |

* cited by examiner

*Primary Examiner*—Hsien-ming Lee
(74) *Attorney, Agent, or Firm*—McGinn IP Law Group, PLLC

(57) ABSTRACT

A vanadium oxide film is formed on an interlayer insulating layer, and a silicon oxide film and a silicon nitride film are formed on the vanadium oxide film in this order. With a resist pattern used as a mask, the silicon nitride film is patterned. Then, the resist pattern is removed using a stripping solution or oxygen plasma ashing. Next, with the patterned silicon nitride film used as a mask, the silicon oxide film and the vanadium oxide film are etched to form a resistor film of vanadium oxide.

20 Claims, 6 Drawing Sheets

INTEGRATED CIRCUIT DEVICE, METHOD OF MANUFACTURING THE SAME AND METHOD OF FORMING VANADIUM OXIDE FILM

BACKGROUND OF THE INVENTION

1. Field of the Invention

The present invention relates to an integrated circuit device with a built-in monolithic temperature sensor, a method of manufacturing the device, and a method of forming a vanadium oxide film, and, more particularly, to an integrated circuit device using a resistor film of vanadium oxide for a temperature sensor, a method of manufacturing the device, and a method of forming a vanadium oxide film.

2. Description of the Related Art

Recently, there are growing needs for monitoring the operation temperature of an integrated circuit device. The purpose of monitoring the operation temperature is preventing thermal breakdown of elements in the integrated circuit device and stabilizing the operation of elements whose characteristic has temperature dependence.

In this respect, Japanese Patent Laid-Open Publication No. H1-302849, for example, discloses a technique of providing a temperature sensor on the same substrate as that of an LSI (Large Scale Integrated circuit). In the technique, the temperature sensor decides that the LSI is abnormally overheated when the temperature detected by the temperature sensor exceeds a predetermined value and then shutting down the LSI. Therefore, it can protect the LSI from thermally broken by a temperature rise. A resistor of which electric resistance changes with the temperature is used as a temperature sensor.

It is preferable that a material whose electric resistivity has as large a temperature coefficient as possible should be used for such a resistor. The present inventors have developed a technique of forming a vanadium oxide film as a resistor having an electric resistivity whose temperature coefficient has a large absolute value, and has disclosed it in, for example, Japanese Patent Laid-Open Publication No. H11-330051.

To form a resistor for measuring the temperature, a vanadium oxide film should be processed into a desired pattern. A typical method of processing a film into a desired pattern is to etch the film using a resist pattern as a mask. FIGS. 1 and 2 are cross-sectional views showing a conventional method of forming a vanadium oxide film step by step.

As shown in FIG. 1, a film 19a of vanadium oxide ($VO_x$) is formed on the entire surface of an insulating layer 17. Next, a resist film is formed on the film 19a, and is patterned by photolithography to thereby form a resist pattern 20. With the resist pattern 20 as a mask, the film 19a is locally etched out. As a result, the film 19a is patterned to form a vanadium oxide film 19 (see FIG. 2). Thereafter, the resist pattern 20 is removed by dissolving the resist pattern 20 into a stripping solution or performing oxygen plasma ashing.

The prior art however has the following problem. As shown in FIG. 2, when the resist pattern 20 (see FIG. 1) is removed, the vanadium oxide film 19 may be damaged, thus forming a damaged portion 21 on the entire top surface and entire side surface of the vanadium oxide film 19. This point will be discussed in detail. In removing the resist pattern 20 with a stripping solution, acidic or alkaline solution or a solution containing an organic solvent is used for the stripping solution. One example of commercially available stripping solutions containing an organic solvent is a chemical containing 50% by mass of DMSO (Dimethyl Sulfoxide), 1% by mass of ammonium fluoride and 30% by mass of water ($H_2O$). However, vanadium oxide has such properties as to be easily dissolved in both an acidic solution and alkaline solution and to be exhausted and dissolvable in water. Even the use of any of an acidic solution, an alkaline solution and a solution containing an organic solvent used as a stripping solution damages the vanadium oxide film 19 of vanadium oxide. When the resist pattern 20 is removed by oxygen plasma ashing, vanadium oxide is overoxidized, increasing the electric resistivity, so that the performance as a temperature sensor is degraded.

The present inventors have developed a technique of overcoming the problem to some extent and disclosed the technique in Japanese Patent Laid-Open Publication No. H11-330051. FIG. 3 is a cross-sectional view illustrating a method of forming a vanadium oxide film described in Japanese Patent Laid-Open Publication No. H11-330051. As shown in FIG. 3, the film 19a of vanadium oxide is formed on the insulating layer 17 by a method similar to the one illustrated in FIG. 1. Next, a silicon oxide film is formed on the film 19a. Then, the resist pattern 20 is formed on the silicon oxide film, and the silicon oxide film is locally etched out using the resist pattern 20 as a mask, thereby forming a patterned silicon oxide film 22. Thereafter, the resist pattern 20 is removed by dissolving the resist pattern 20 into a stripping solution or performing oxygen plasma ashing. Then, using the patterned silicon oxide film 22 as a mask, the film 19a is locally etched out, thereby forming a vanadium oxide film.

Because that portion of the film 19a which remains to be a vanadium oxide film after patterning is covered with the silicon oxide film 22 at the time of removing the resist pattern 20, this technology can prevent damages to the portion by the stripping solution or the oxygen plasma ashing to some extent.

The prior art however has the following problem. FIG. 4 is a cross-sectional views showing the problem of the prior art described in Japanese Patent Laid-Open Publication No. H11-330051. As shown in FIG. 4, in removing the resist pattern 20 (see FIG. 3), that portion of the film 19a which remains to be a vanadium oxide film after patterning is covered with the silicon oxide film 22, so that the entire top surface of the vanadium oxide film 19 is prevented from being damaged as shown in FIG. 2. However, the top surface of that portion of the film 19a which is not covered with the silicon oxide film 22 is damaged, and the damaged portion penetrates a part of the portion covered with the silicon oxide film 22. Apparently, even the technology disclosed in Japanese Patent Laid-Open Publication No. H11-330051 cannot completely inhibit damages on the resistor film.

SUMMARY OF THE INVENTION

It is an object of the present invention to provide an integrated circuit device having an undamaged vanadium oxide film as a resistor film to be used for a temperature sensor, and a method of manufacturing an integrated circuit device which can form a resistor film of vanadium oxide without damaging the resistor film and a method of forming a vanadium oxide film.

An integrated circuit device according to the invention comprises: a resistor film connected between two wires and containing vanadium oxide; a first film which is provided on the resistor film, formed in a same pattern as the resistor film as seen from a direction perpendicular to a top surface of the resistor film, and formed of a first material different from vanadium oxide; and a second film which is provided on the first film, formed in a same pattern as the resistor film and the first film as seen from a direction perpendicular to a top surface of the resistor film, and formed of a second material different from vanadium oxide and the first material.

According to the invention, the temperature of the integrated circuit device can be measured by measuring the electric resistance of a resistor film. As the first film and the second film, patterned in the same pattern as the resistor film, as seen from a direction perpendicular to the top surface of the resistor film (hereinafter referred to as "in a plan view"), are provided on the resistor film, the resistor film can be protected by the first film when removing the resist film which has been used at the time of patterning the second film, so that the resistor film can be patterned by using the patterned second film as a mask.

The second material may be a metal or an alloy, or may be one metal selected from a group consisting of Al, Ti, Cu, Ta, W and Ni, or an alloy of the metal, or an alloy essentially consisting of two or more metals in the group. Accordingly, the second film serves as a thermal conducting layer which makes the ambient temperature of the resistor film uniform, thereby making the temperature measuring precision higher.

It is preferable that the integrated circuit device according to the invention should further comprise: a substrate; a multi-layer wiring structure provided on the substrate; and a logic circuit section provided at a top surface of the substrate and wiring layers located below a topmost layer of the multi-layer wiring structure, the resistor film being laid at the topmost layer of the multi-layer wiring structure. This can prevent the logic circuit section from being contaminated by vanadium oxide.

A method of manufacturing an integrated circuit device according to the invention comprises: forming an insulating film at whose top surface two wires are exposed on a substrate; forming a film containing vanadium oxide on that region of the insulating film which includes wire-exposing portions at which the two wires are exposed; forming a first film of a first material different from vanadium oxide on the film; forming a second film of a second material different from vanadium oxide and the first material on the first film; forming a resist film on the second film; patterning the resist film in such a way that the resist film remains at a region including a region directly overlying the wire-exposing portions and a region where the wire-exposing portions are connected; selectively etching out the second film using the patterned resist film as a mask; removing the patterned resist film; and selectively etching out the first film and the film containing vanadium oxide using the patterned second film as a mask.

According to the invention, as the first film is formed on the entire surface of the film containing vanadium oxide in the removing of the resist film, the film containing vanadium oxide is not exposed to a stripping solution or oxygen plasma ashing and will not be damaged. A resistor film can be formed by etching the first film and the film containing vanadium oxide by using the patterned second film as a mask.

The removing of the patterned resist film may comprise dissolving the resist film in a stripping solution, or may comprise performing oxygen plasma ashing on the resist film.

A method of forming a vanadium oxide film according to the invention comprises: forming a film containing vanadium oxide on a substrate; forming a first film of a first material different from vanadium oxide on the film; forming a second film of a second material different from vanadium oxide and the first material on the first film; forming a resist film on the second film; patterning the resist film; selectively etching out the second film using the patterned resist film as a mask; removing the patterned resist film; and selectively etching out the first film and the film containing vanadium oxide using the patterned second film as a mask.

According to the invention, as the first film is formed on the entire surface of the film containing vanadium oxide in the removing of the resist film, the film containing vanadium oxide is not exposed to a stripping solution or oxygen plasma ashing and will not be damaged. A resistor film can be formed by etching the first film and the film containing vanadium oxide by using the patterned second film as a mask.

According to the invention, the first film and the second film are deposited on the film containing vanadium oxide, the second film is patterned by using the resist film as a mask, and the resist film is removed, then, the first film and the film containing vanadium oxide are patterned by using the patterned second film as a mask, so that the film containing vanadium oxide is protected by the first film at the time of removing the resist film. This makes it possible to provide an integrated circuit device having an undamaged resistor film.

DETAILED DESCRIPTION OF THE PREFERRED EMBODIMENTS

Figure 1:
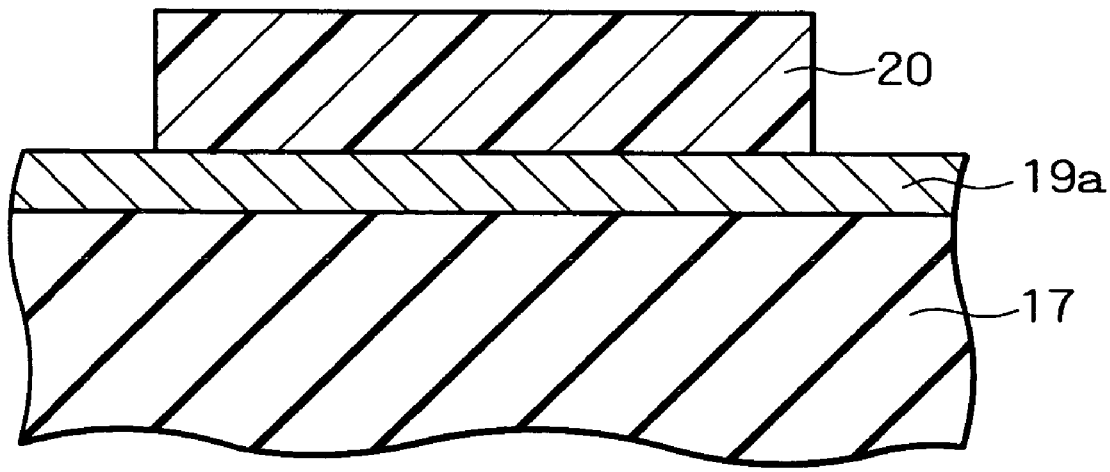
FIG. 1 is a cross-sectional view showing a conventional method of forming a vanadium oxide film.
Figure 2:
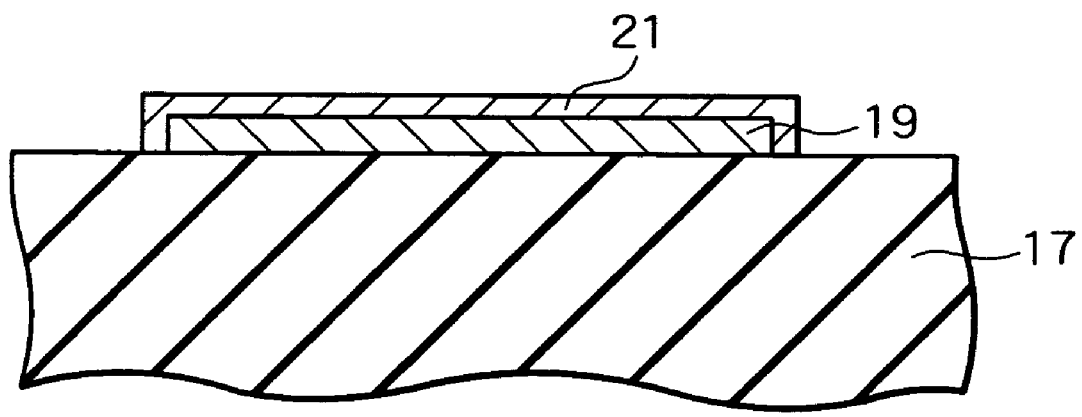
FIG. 2 is a cross-sectional view showing the conventional method of forming the vanadium oxide film and a next step to the step in FIG. 1.
Figure 3:
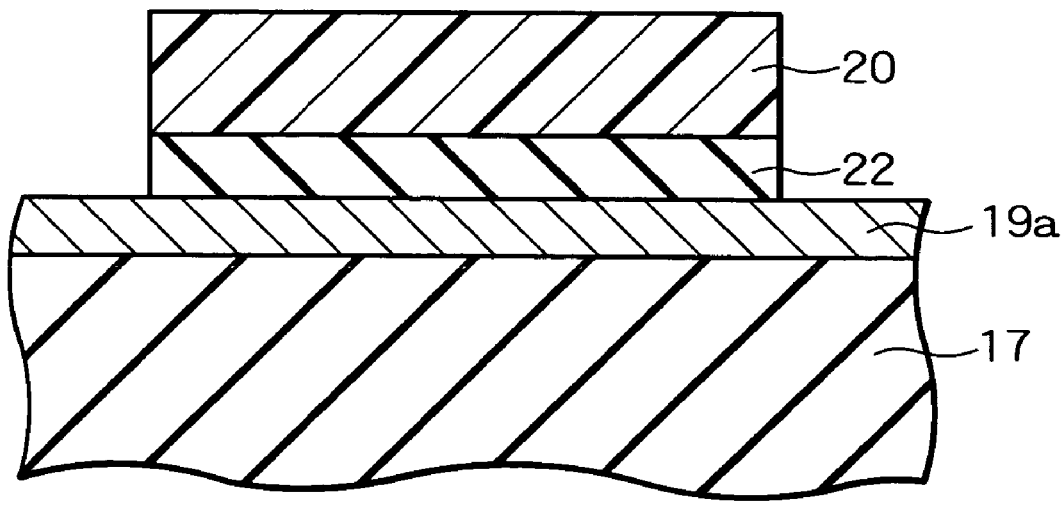
FIG. 3 is a cross-sectional view showing a conventional method of forming a vanadium oxide film as described in Japanese Patent Laid-Open Publication No. H11-330051.
Figure 4:
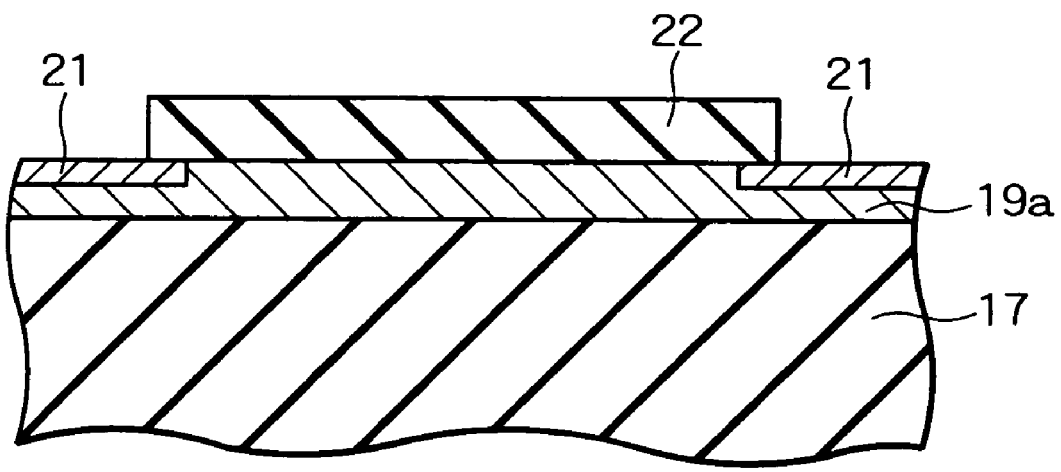
FIG. 4 is a cross-sectional view showing the problem of the technology illustrated in FIG. 3.
Figure 5:
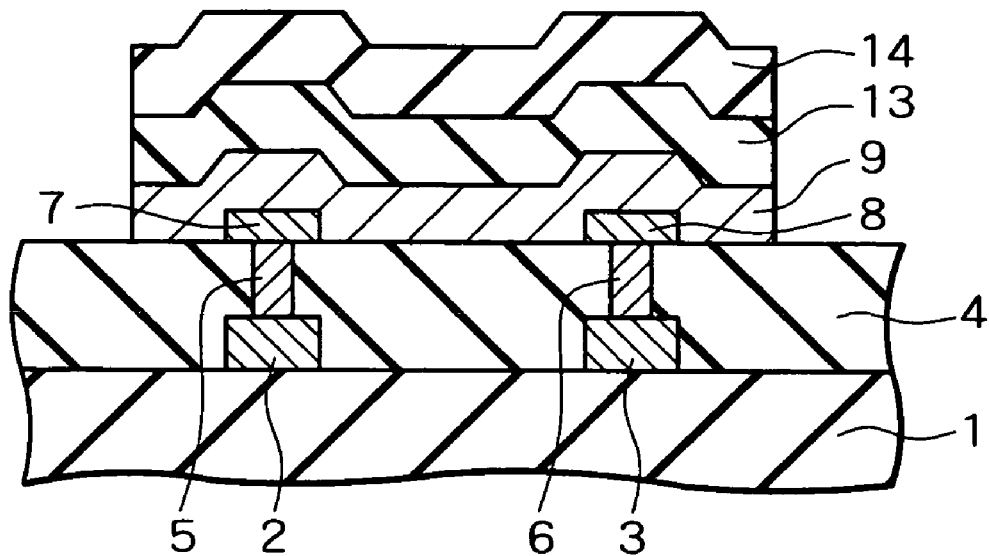
FIG. 5 is a cross-sectional view showing an integrated circuit device according to a first embodiment of the invention.

Preferred embodiments of the invention will be specifically described below with reference to the accompanying drawings. To begin with, the first embodiment of the invention will be discussed. FIG. 5 is a cross-sectional view showing an integrated circuit device according to the first embodiment. As shown in FIG. 5, the integrated circuit device according to the embodiment is provided with, for example, a P type silicon substrate (not shown), on which an interlayer insulating film 1 is provided. An interlayer insulating film 4 is provided on the interlayer insulating film 1. Two wires 2 and 3 of, for example, aluminum (Al) are provided in the interlayer insulating film 4 in such a way as to contact the top surface of the interlayer insulating film 1. Vias 5 and 6 are formed in the interlayer insulating film 4 at that portions lying over the wires 2 and 3 in such a way as to be respectively connected to the wires 2 and 3. Wires 7 and 8 of, for example, titanium (Ti) are formed on the interlayer insulating film 4 in such a way as to be respectively connected to the vias 5 and 6. Accordingly, the wire 7 is connected to the wire 2 through the via 5, and the wire 8 to the wire 3 through the via 6.

A resistor film 9 is formed on the interlayer insulating film 4 in such a way as to contact the wires 7 and 8 and to be connected between the wire 7 and the wire 8. Specifically, one end of the resistor film 9 is connected to the wire 7, while the other end is connected to the wire 8. The resistor film 9 is made of vanadium oxide. Stable compounds of vanadium oxide are, for example, $VO_2$ and $V_2O_5$, and vanadium oxide is expressed by the chemical formula, $VO_x$, where x is around "2". The volume resistivity of the vanadium oxide when the temperature is 25° C. is, for example, 0.01 to 10 ($\Omega \cdot cm$) on the silicon wafer, and the temperature coefficient, which differs depending on the manufacture method, is about $-1.5$ (%/K). The resistance of the resistor film 9 is, for example, several hundred $\Omega$, e.g., 300 $\Omega$.

A silicon oxide film 13 of silicon oxide, e.g., $SiO_2$, is formed on the resistor film 9. The silicon oxide film 13 is patterned in the same pattern as the resistor film 9 as seen from a direction perpendicular to the top surface of the interlayer insulating film 4, i.e., in a plan view. Further, a silicon nitride film 14 of silicon nitride, e.g., SiN, formed on the silicon oxide film 13. The silicon nitride film 14 is patterned in the same pattern as the resistor film 9 and the silicon oxide film 13 in a plan view. The thicknesses of the resistor film 9, the silicon oxide film 13, and the silicon nitride film 14 are each 200 nm, for example.

The wire 2, for example, is connected to the silicon substrate through a contact (not shown) formed in the interlayer insulating film 1, and is connected to a ground potential wire (not shown) through the silicon substrate. The wire 3 is connected to one end of a comparative resistor film (not shown) of, for example, polysilicon through another contact (not shown) formed in the interlayer insulating film 1, while the other end of the comparative resistor film is connected to a power-source potential wire (not shown). The wire 3 is connected to an output terminal (not shown). Accordingly, the comparative resistor film, the wire 3, and the resistor film 9 connected in series from the power-source potential wire toward the ground potential wire in the named order. An insulating film (not shown) is provided on the interlayer insulating film 4 in such a way as to bury the resistor film 9, the silicon oxide film 13 and the silicon nitride film 14. The resistor film 9 is provided at, for example, the topmost layer in the multi-layer wiring structure in the integrated circuit device.

The operation of the integrated circuit device according to the embodiment with the above-described structure will be described referring to FIG. 5. The ground potential is applied to one end of the resistor film 9 through the silicon substrate, the wire 2, the via 5 and the wire 7. The power-source potential is applied to the other end of the comparative resistor film of polysilicon. As a result, the potential of the wire 3 connected between the other end of the resistor film 9 and one end of the comparative resistor film becomes a potential divided by the resistor film 9 and the comparative resistor film. The temperature coefficient of the electric resistivity of vanadium oxide film which is the material for the resistor film 9 takes a negative value, so that when the temperature rises, the electric resistance of the resistor film 9 decreases. The electric resistance of the comparative resistor film of polysilicon does not change as much as the electric resistance of the resistor film 9 even when the temperature changes. As the temperature of the integrated circuit device rises, therefore, the potential of the output terminal connected to the wire 3 drops. This makes it possible to measure the temperature of the integrated circuit device by measuring the potential of the output terminal.

As the resistor film 9 is connected between the wire 7 and the wire 8 according to the embodiment, as discussed above, the temperature can be measured by detecting the electric resistance of the resistor film 9. As the resistor film 9 is formed of vanadium oxide, the temperature can be measured accurately.

Figure 6:
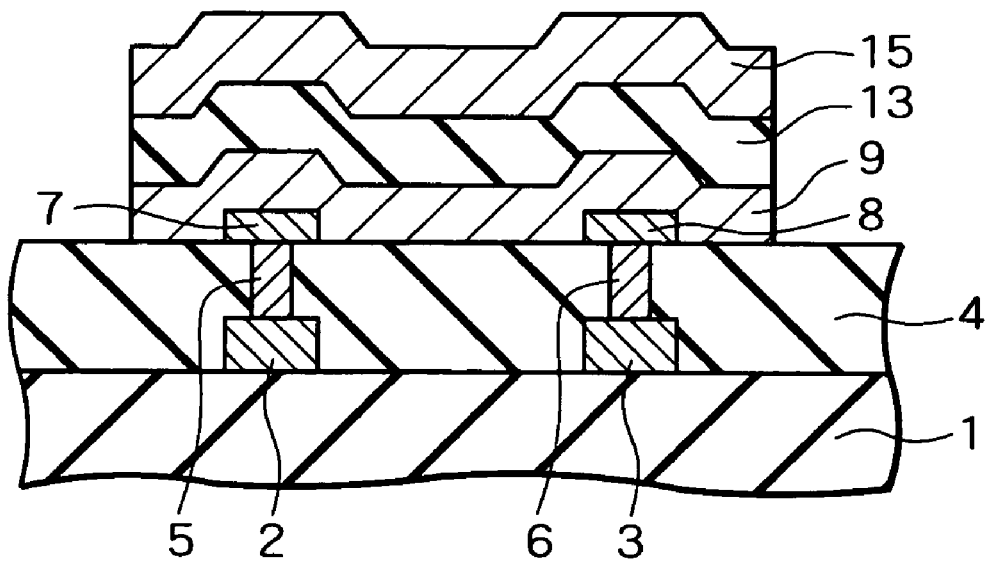
FIG. 6 is a cross-sectional view showing an integrated circuit device according to a second embodiment of the invention.

The second embodiment of the invention will be discussed next. FIG. 6 is a cross-sectional view showing an integrated circuit device according to the second embodiment. As shown in FIG. 6, the embodiment differs from the first embodiment in that an aluminum film 15 of aluminum or an aluminum alloy is provided in place of the silicon nitride film 14 (see FIG. 5). The aluminum film 15 is patterned in the same pattern as the resistor film 9 and the silicon oxide film 13 in a plan view. The other structure of the embodiment is the same as that of the first embodiment.

The operation of the integrated circuit device according to the embodiment with the above-described structure will be described referring to FIG. 6. In the first embodiment, as the current flows cross the wires (not shown) or the like laid around the resistor film 9, heat may be locally generated around the resistor film 9, making the ambient temperature distribution of the resistor film 9 nonuniform. In such a case, the temperature distribution in the resistor film 9 also becomes nonuniform, dropping the temperature measuring precision slightly.

According to the embodiment, the aluminum film 15 with a high thermal conductance is provided at a region lying directly above the resistor film 9 in the same pattern as the resistor film 9 in a plan view. This allows the heat to conduct inside the aluminum film 15, thus making the ambient temperature of the resistor film 9 uniform, so that the temperature can be measured more accurately. The other operation of the embodiment is the same as that of the first embodiment.

According to the embodiment, as discussed above, the aluminum film 15 makes the ambient temperature of the resistor film 9 uniform, so that the temperature can be measured more accurately. The other effects of the embodiment are the same as those of the first embodiment.

In the embodiment, the aluminum film 15 may be replaced with a film of another metal or another alloy. For example, a film of titanium (Ti), copper (Cu), tantalum (Ta), tungsten (W) or nickel (Ni) may be provided, or a film of an alloy containing one or two or more metals selected from those metals and Al may be provided.

Figure 7:
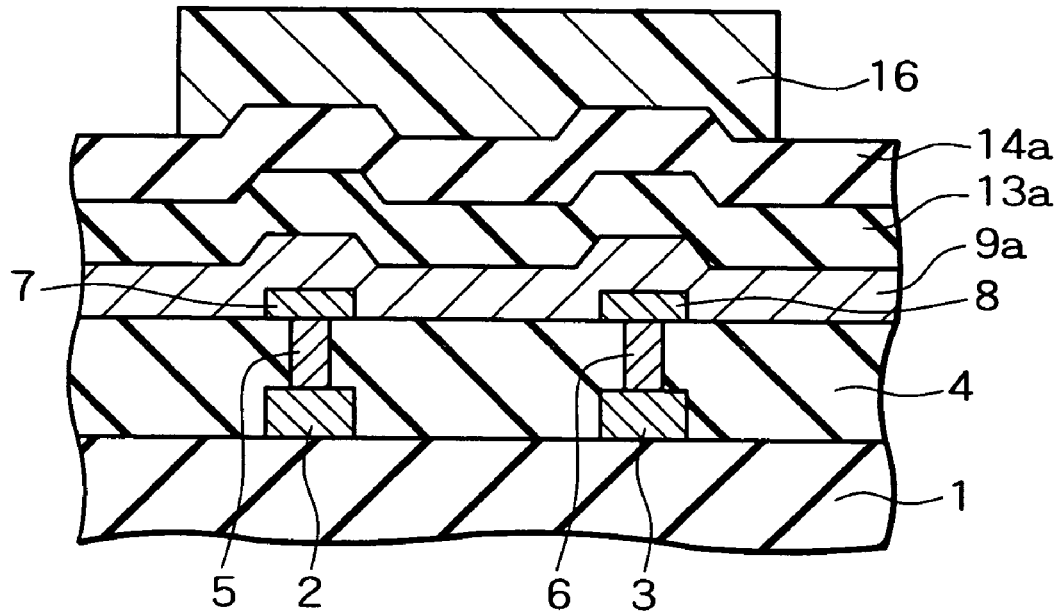
FIG. 7 is a cross-sectional view showing a method of manufacturing an integrated circuit device according to a third embodiment of the invention.
Figure 8:
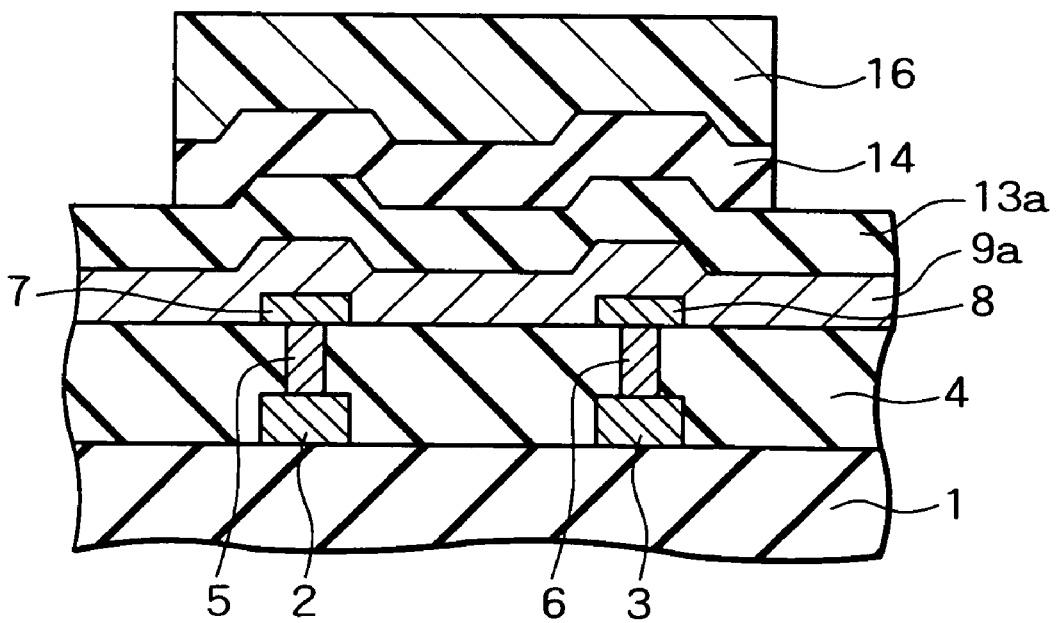
FIG. 8 is a cross-sectional view showing the method of manufacturing the integrated circuit device according to the third embodiment of the invention and a next step to the step in FIG. 7.
Figure 9:
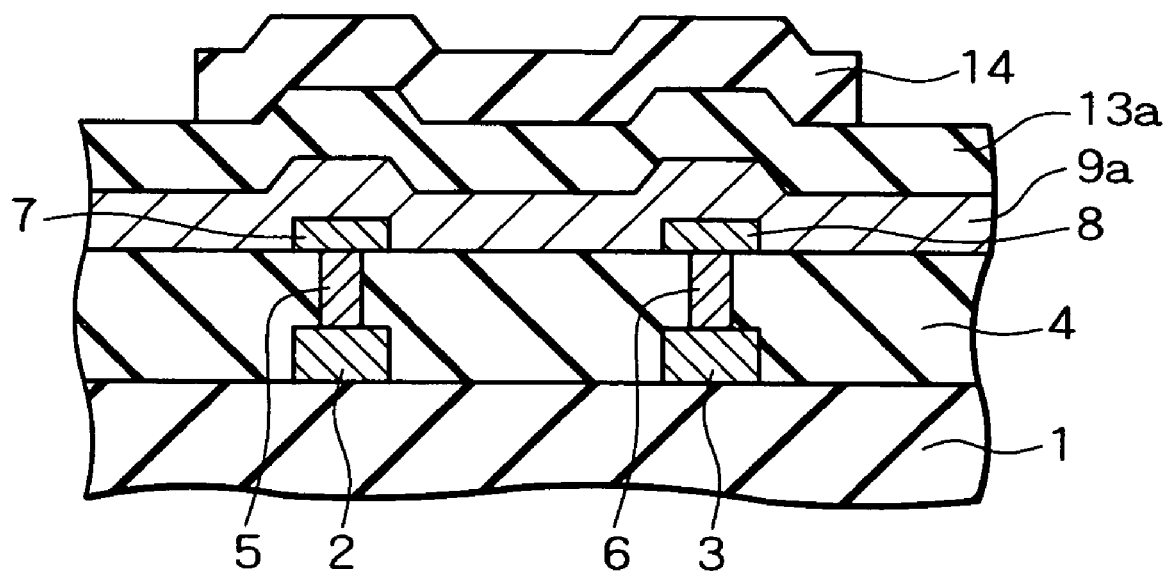
FIG. 9 is a cross-sectional view showing the method of manufacturing the integrated circuit device according to the third embodiment of the invention and a next step to the step in FIG. 8.

The third embodiment of the invention will be discussed next. FIGS. 7 to 9 are cross-sectional views showing a method of manufacturing an integrated circuit device according to the embodiment step by step. This embodiment is an embodiment of the method of manufacturing the integrated circuit device according to the first embodiment.

First, as shown in FIG. 7, a predetermined diffusion region, a device isolation region and the like are formed on the top surface of, for example, a P type silicon substrate (not shown). Next, the interlayer insulating film 1 is formed on the silicon substrate, and the two wires 2 and 3 are formed of, for example, aluminum. Next, the interlayer insulating film 4 is formed in such a way as to bury the wires 2 and 3. Then, the vias 5 and 6 are formed in the interlayer insulating film 4 in such a way as to be connected to the wires 2 and 3, respectively. Next, the wires 7 and 8 of, for example, titanium are formed on the interlayer insulating film 4 in such a way as to be connected to the vias 5 and 6, respectively. At this time, the wires 7 and 8 are exposed on the interlayer insulating film 4. In the step of forming the interlayer insulating film 1 and the steps of forming the wires 2 and 3, the interlayer insulating film 4, the vias 5 and 6, and the wires 7 and 8, the comparative resistor film (not shown) and the wires or the like to be connected thereto are formed.

Next, a film 9a of vanadium oxide ($VO_x$) is formed, for example, 200 nm thick on the entire surface of the interlayer insulating film 4 by sputtering. Next, $SiO_2$ is deposited, for example, 200 nm thick on the film 9a by plasma CVD (Chemical Vapor Deposition), thereby forming a silicon oxide film 13a. Then, SiN is deposited, for example, 200 nm thick on the silicon oxide film 13a by plasma CVD, thus forming a silicon nitride film 14a. Then, a resist film is formed, for example, 2.0 µm thick on the silicon nitride film 14a by coating, and the resist film is patterned by photolithography to form a resist pattern 16. At this time, the resist pattern 16 is made to remain at a region reserved for formation of the resistor film 9 (FIG. 5) in a later step. That is, the resist pattern is made to remain at a region containing a region lying directly above the wires 7 and 8 and a region where both the wires 7 and 8 are connected.

Next, as shown in FIG. 8, the silicon nitride film 14a (see FIG. 7) is locally removed by dry etching using the resist pattern 16 as a mask. The etching is carried out under the condition that provides a high selective ratio of the etching ratio between the silicon nitride film and the silicon oxide film, i.e., under the condition such that the silicon oxide film 13a is hardly etched while the silicon nitride film 14a is etched. For example, etching is done with plasma etching using a single type anisotropic dry etching apparatus, the etching gas is a $CF_4$ gas, the flow rate of the etching gas is 20 milliliters/min (20 sccm), the pressure in the chamber is 8 Pa, the applied power is 600 W, and the etching time is 120 seconds. Accordingly, the silicon nitride film of 240 nm is etched out in computation. If the thickness of the silicon nitride film 14a before etching is 200 nm, therefore, all the portion of the silicon nitride film 14a which is not covered with the resist pattern 16 is removed under the condition. As a result, the silicon nitride film 14a is patterned, forming the silicon nitride film 14 that has the same pattern as the resist pattern 16 in a plan view.

Next, the resist pattern 16 is dissolved and removed in a stripping solution. An acidic solution, an alkaline solution or a solution containing an organic solvent is used as the stripping solution; for example, a stripping solution containing 50% by mass of DMSO, 1% by mass of ammonium fluoride and 30% by mass of water ($H_2O$) is used. Because the film 9a of vanadium oxide is covered with the silicon oxide film 13a at this time, the film 9a does not contact the stripping solution.

Next, as shown in FIG. 9, the silicon oxide film 13a is locally removed by dry etching using the silicon nitride film 14 as a mask. The etching is executed under the condition that provides a high selective ratio of the etching ratio between the silicon oxide film and the silicon nitride film, i.e., under the condition such that the silicon nitride film 14 is hardly etched while the silicon oxide film 13a is etched. For example, etching is executed with plasma etching using a single type anisotropic dry etching apparatus. A gas mixture of a $C_4F_8$ gas, an Ar gas, a CO gas and an $O_2$ gas is used as the etching gas, the flow rate of the etching gas is 18.0 milliliters/min of the $C_4F_8$ gas, 400 milliliters/min of the Ar gas, 70 milliliters/min of the CO gas, and 8.5 milliliters/min of the $O_2$ gas. The pressure in the chamber is 4 Pa, the applied power is 2000 W, and the etching time is 60 seconds.

Accordingly, the silicon oxide film of 250 nm can be etched out in computation. If the thickness of the silicon oxide film 13a before etching is 200 nm, therefore, all the portion of the silicon oxide film 13a which is not covered with the silicon nitride film 14 is removed under the condition. As a result, the silicon oxide film 13a is patterned, forming the silicon oxide film 13 (see FIG. 5) that has the same pattern as the silicon nitride film 14 in a plan view.

Figure 10:
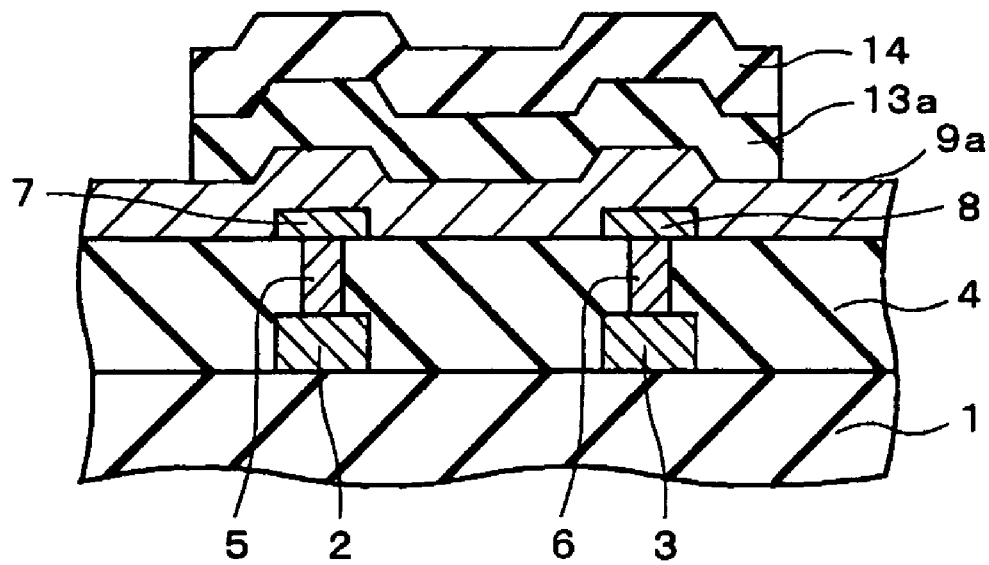
FIG. 10 is a cross-sectional view showing the method of manufacturing the integrated circuit device according to the third embodiment of the invention and a next step to the step in FIG 9.
Figure 11:
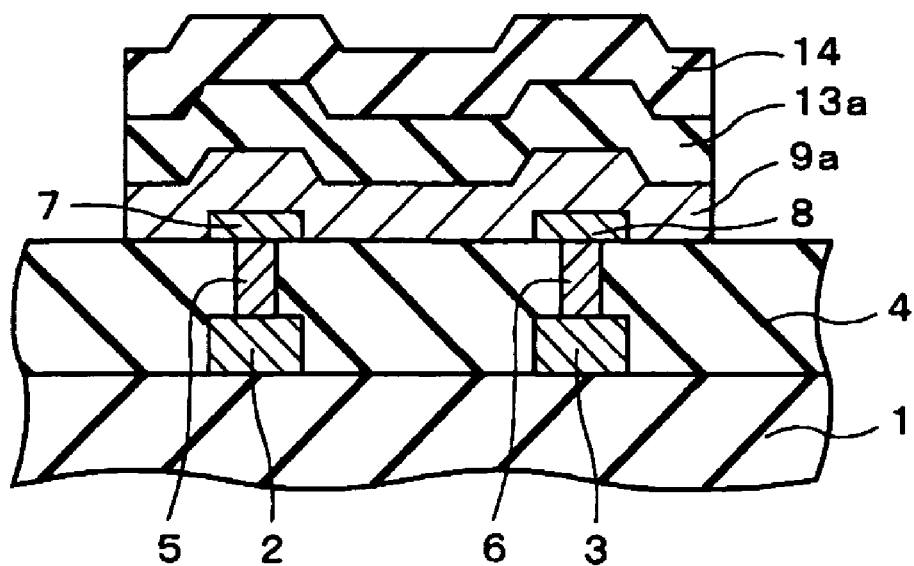
FIG. 11 is a cross-sectional view showing the method of manufacturing the integrated circuit device according to the third embodiment of the invention and a next step to the step in FIG. 10.

Next, as shown in FIG. 5 and to FIGS. 9-11, the film 9a of vanadium oxide is locally removed by dry etching with the silicon nitride film 14 left as a mask while changing the etching condition. The etching is executed under the condition that provides a high selective ratio of the etching ratio between the vanadium oxide film and the silicon nitride film, i.e., under the condition such that the silicon nitride film 14 is hardly etched while the film 9a of vanadium oxide is etched. For example, etching is executed with plasma etching using a batch type anisotropic dry etching apparatus. A gas mixture of and $SF_6$ gas and $CO_2$ gas is used ax the etching gas. The flow rate of the etching gas is 30 milliliters/min of the SF6 gas and 70 milliliters/min of the CO2 gas. The pressure in the chamber is 10 Pa, the applied power is 500 W, and the etching time is 60 seconds.

Accordingly, vanadium oxide of 300 nm can be etched out in computation. If the thickness of the film 9a (see FIG. 9) before etching is 200 nm, therefore, all the portion of the film 9a which is not covered with the silicon oxide film 13 and the silicon nitride film 14 is removed by the etching. As a result, the film 9a is patterned, forming the resistor film 9 of vanadium oxide that has the same pattern as the silicon nitride film 14 and the silicon oxide film 13 in a plan view. Under the etching condition, the selective ratio of the vanadium oxide film to the silicon nitride film is about 5. Therefore, the etching causes the silicon nitride film 14 to be etched by about 60 nm (=300 nm/5). As the thickness of the silicon nitride film 14 before etching is 200 nm, however, the silicon nitride film 14 remains about 140 nm after the film 9a is etched. The silicon nitride film 14 can therefore sufficiently serve as a mask during etching of the film 9a.

Thereafter, an insulating film (not shown) is formed on the interlayer insulating film 4 to bury the resistor film 9, the silicon oxide film 13 and the silicon nitride film 14. This completes the manufacture of the integrated circuit device according to the first embodiment.

As the film 9a of vanadium oxide is covered with the silicon oxide film 13a when removing the resist pattern 16 in the step shown in FIG. 8 in the embodiment, the film 9a does not contact the resist stripping solution. This prevents the film 9a from being damaged by the stripping solution, so that the resistor film 9 does not have damages. In addition, the stripping solution is not contaminated by vanadium oxide, so that other products to be manufactured by the same manufacture equipment will not be contaminated by an otherwise contaminated stripping solution.

The fourth embodiment of the invention will be discussed next. The embodiment is an embodiment of the method of manufacturing the integrated circuit device according to the second embodiment. The fourth embodiment differs from the third embodiment in that the aluminum film 15 (see FIG. 6) is formed in place of the silicon nitride film 14 (see FIG. 5).

First, the interlayer insulating films 1 and 4, the wires 2, 3, 7 and 8, the vias 5 and 6, the film 9a of vanadium oxide, and the silicon oxide film 13a (see FIG. 7) are formed on the silicon substrate by a method similar to the method of the third embodiment. That is, the interlayer insulating film 1 is formed on the silicon substrate of, for example, a P type, the wires 2 and 3 are formed on the interlayer insulating film 1, and the interlayer insulating film 4 is formed in such a way as to bury the wires 2 and 3. Next, the vias 5 and 6 are formed in the interlayer insulating film 4, and the wires 7 and 8 are formed on the interlayer insulating film 4. Then, the film 9a of vanadium oxide is deposited on the entire surface of the interlayer insulating film 4 by sputtering, and the silicon oxide film 13a is formed on the film 9a by plasma CVD.

Next, an aluminum film of aluminum or an aluminum alloy is deposited, for example, 200 nm thick on the silicon oxide film 13a. Then, a resist pattern is formed on the aluminum film. Next, the aluminum film is locally removed by dry etching using the resist pattern as a mask. The etching is executed under the condition that provides a high selective ratio of the etching ratio between the aluminum film and the silicon oxide film, i.e., under the condition such that the silicon oxide film 13a is hardly etched while the aluminum film is etched. Accordingly, the aluminum film is patterned, forming the aluminum film 15 (see FIG. 6) that has the same pattern as the resist pattern in a plan view.

Next, the resist pattern is removed by $O_2$ (oxygen) plasma ashing. The $O_2$ plasma ashing is executed using, for example, a single type resist ashing apparatus, using an $O_2$ gas with the gas flow rate of 500 milliliters/min, the internal chamber pressure of 80 Pa, the applied power of 1000 W, the temperature of 140° C. and the etching time of 90 seconds.

Next, as shown in FIG. 6, with the patterned aluminum film 15 used as a mask, the silicon oxide film 13a (see FIG. 7) is locally removed by dry etching. The etching is executed under the condition that provides a high selective ratio of etching ratio between the silicon oxide film and the aluminum film, i.e., under the condition such that the aluminum film 15 is hardly etched while the silicon oxide film 13a is etched. Accordingly, the silicon oxide film 13a is patterned, forming the silicon oxide film 13 that has the same pattern as the aluminum film 15 in a plan view.

Next, with the aluminum film 15 left as a mask, the film 9a (see FIG. 9) of vanadium oxide is locally removed by dry etching while changing the etching condition. The etching is executed under the condition that provides a high selective ratio of the etching ratio between the vanadium oxide film and the aluminum film, i.e., under the condition such that the aluminum film 15 is hardly etched while the film 9a of vanadium oxide is etched. Accordingly, the film 9a is patterned, forming the resistor film 9 of vanadium oxide that has the same pattern as the aluminum film 15 and the silicon oxide film 13 in a plan view. Thereafter, an insulating film (not shown) is formed on the interlayer insulating film 4 to bury the resistor film 9, the silicon oxide film 13 and the aluminum film 15. This completes the manufacture of the integrated circuit device according to the second embodiment.

Because the film 9a of vanadium oxide is covered with the silicon oxide film 13a at the time of removing the resist pattern in the embodiment as per the third embodiment, the film 9a is not exposed to the plasma ashing atmosphere. Accordingly, the film 9a is not overoxidized, so that the resistivity of the resistor film 9 does not decrease.

According to the embodiment, a film containing at least one kind of metal in the group consisting of Al, Ti, Cu, Ta, W and Ni may be provided in place of the aluminum film.

The resist pattern may be removed by $O_2$ plasma ashing in the third embodiment, or may be removed by a stripping solution in the fourth embodiment.

Although the silicon oxide film 13 is provided in each of the embodiments, the invention is not limited to this particular example. Any film can be provided on the resistor film 9 as long as the film provides a high selective ratio of etching ratio to a film which is formed on that film, such as the silicon nitride film 14 or the aluminum film 15. For example, a silicon nitride film may be provided on the resistor film 9, and a silicon oxide film may be provided on the silicon nitride film.

Further, another single interlayer insulating film or plural interlayer insulating films may be provided between the silicon substrate and the interlayer insulating film 1, and wires and vias or the like may be formed in the latter interlayer insulating film.

Although the wires 2 and 3 are formed of aluminum and the wires 7 and 8 are formed of titanium in each of the embodiments, the invention is not limited to this example and the wires may be formed of other metals or alloys. The wires 7 and 8 may be formed of titanium nitride (TiN).

What is claimed is:

1. An integrated circuit device comprising:
    a resistor film connected between two wires and containing vanadium oxide;
    a first film which is provided on said resistor film, formed in a same pattern as said resistor film as seen from a direction perpendicular to a top surface of said resistor film, and formed of a first material different from vanadium oxide; and
    a second film which is provided on said first film, formed in a same pattern as said resistor film and said first film as seen from said direction perpendicular to said top surface of said resistor film, and formed of a second material different from vanadium oxide and said first material.

2. The integrated circuit device according to claim 1, wherein said first material comprises an insulating material containing silicon.

3. The integrated circuit device according to claim 1, wherein said second material comprises an insulating material containing silicon.

4. The integrated circuit device according to claim 1, wherein said second material comprises a metal or an alloy.

5. The integrated circuit device according to claim 4, wherein said second material is one metal selected from a group consisting of Al, Ti, Cu, Ta, W and Ni, or an alloy of said metal, or an alloy consisting essentially of two or more metals in said group.

6. The integrated circuit device according to claim 1, further comprising:
    a substrate;
    a multi-layer wiring structure provided on said substrate; and
    a logic circuit section provided at a top surface of said substrate and wiring layers located below a topmost layer of said multi-layer wiring structure, said resistor film being laid at said topmost layer of said multi-layer wiring structure.

7. A method of manufacturing an integrated circuit device, comprising:
    forming an insulating film at whose top surface two wires are exposed on a substrate;
    forming a film containing vanadium oxide on a region of said insulating film which includes wire-exposing portions at which said two wires are exposed;
    forming a first film of a first material different from vanadium oxide on said film;

forming a second film of a second material different from vanadium oxide and said first material on said first film;
forming a resist film on said second film;
patterning said resist film in such a way that said resist film remains at a region including a region directly overlying said wire-exposing portions and a region where both two wires are connected;
selectively etching out said second film using said patterned resist film as a mask;
removing said patterned resist film; and
selectively etching out said first film and said film containing vanadium oxide using said etched second film as a mask.

8. The method according to claim 7, wherein said removing of said patterned resist film comprises dissolving said resist film in a stripping solution.

9. The method according to claim 7, wherein said removing of said patterned resist film comprises performing oxygen plasma ashing on said resist film.

10. The method according to claim 7, wherein in said forming of said first film, said first material comprises an insulating material containing silicon.

11. The method according to claim 7, wherein in said forming of said second film, said second material comprises an insulating material containing silicon.

12. The method according to claim 7, wherein in said forming of said second film, said second material comprises a metal or an alloy.

13. The method according to claim 12, wherein said second material is one metal selected from a group consisting of Al, Ti, Cu, Ta, W and Ni, or an alloy of said metal, or an alloy consisting essentially of two or more metals in said group.

14. A method of forming a vanadium oxide film, comprising:
forming a film containing vanadium oxide on a substrate;
forming a first film of a first material different from vanadium oxide on said film;
forming a second film of a second material different from vanadium oxide and said first material on said first film;
forming a resist film on said second film;
patterning said resist film;
selectively etching out said second film using said patterned resist film as a mask;
removing said patterned resist film; and
selectively etching out said first film and said film containing vanadium oxide using said etched second film as a mask.

15. The method according to claim 14, wherein said removing of said patterned resist film comprises dissolving said resist film in a stripping solution.

16. The method according to claim 14, wherein said removing of said patterned resist film comprises performing oxygen plasma ashing on said resist film.

17. The method according to claim 14, wherein in said forming of said first film, said first material comprising an insulating material containing silicon.

18. The method according to claim 14, wherein in said forming of said second film, said second material comprising an insulating material containing silicon.

19. The method according to claim 14, wherein in said forming of said second film, said second material comprising a metal or an alloy.

20. The method according to claim 19, wherein said second material is one metal selected from a group consisting of Al, Ti, Cu, Ta, W and Ni, or an alloy of said metal, or an alloy consisting essentially of two or more metals in said group.

* * * * *